US009936153B1

United States Patent
Mao et al.

(10) Patent No.: US 9,936,153 B1
(45) Date of Patent: Apr. 3, 2018

(54) CMOS IMAGE SENSOR WITH DUAL FLOATING DIFFUSIONS PER PIXEL FOR FLICKER-FREE DETECTION OF LIGHT EMITTING DIODES

(71) Applicant: OMNIVISION TECHNOLOGIES, INC., Santa Clara, CA (US)

(72) Inventors: Duli Mao, Sunnyvale, CA (US); Trygve Willassen, Oppegaard (NO); Johannes Solhusvik, Haslum (NO); Keiji Mabuchi, Los Altos, CA (US); Gang Chen, San Jose, CA (US); Sohei Manabe, San Jose, CA (US); Dyson H. Tai, San Jose, CA (US); Bill Phan, San Jose, CA (US); Oray Orkun Cellek, Santa Cruz, CA (US); Zhiqiang Lin, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/285,352

(22) Filed: Oct. 4, 2016

(51) Int. Cl.
*H04N 5/361* (2011.01)
*H04N 5/374* (2011.01)
(Continued)

(52) U.S. Cl.
CPC ....... *H04N 5/361* (2013.01); *H01L 27/14636* (2013.01); *H01L 27/14656* (2013.01); *H04N 5/374* (2013.01); *H04N 5/378* (2013.01)

(58) Field of Classification Search
CPC ........ H04N 5/361; H04N 5/374; H04N 5/378; H01L 27/14636; H01L 27/14656
(Continued)

(56) References Cited

U.S. PATENT DOCUMENTS 7,286,174 B1   10/2007  Weale et al.
2008/0036888 A1*  2/2008  Sugawa ............... H04N 3/1568
                                                             348/294
(Continued)

OTHER PUBLICATIONS

Kim et al., "A Wide Dynamic Range CMOS Image Sensor With Dual Capture Using Floating Diffusing Capacitor," Proc. IEEE Int. Image Sensor, pp. 90-93 (2007).
(Continued)

*Primary Examiner* — Lin Ye
*Assistant Examiner* — Chan T Nguyen
(74) *Attorney, Agent, or Firm* — Christensen O'Connor Johnson Kindness PLLC (57) ABSTRACT

Apparatuses and methods for image sensors with pixels that reduce or eliminate flicker induced by high intensity illumination are disclosed. An example image sensor may include a photodiode, a transfer gate, an anti-blooming gate, and first and second source follower transistors. The photodiode may capture light and generate charge in response, and the photodiode may have a charge capacity. The transfer gate may selectively transfer charge to a first floating diffusion, and the anti-blooming gate may selectively transfer excess charge to a second floating diffusion when the generated charge is greater than the photodiode charge capacity. The first source-follower transistor may be directly coupled to the first floating diffusion by a gate, the first source-follower to selectively output a first signal to a first bitline in response to enablement of a first row selection transistor, and the second source-follower transistor may be capacitively-coupled to the second floating diffusion, the second source-follower to selectively output a second signal to a second bitline in response to enablement of a second row selection transistor.

15 Claims, 5 Drawing Sheets

(51) Int. Cl.
*H04N 5/378* (2011.01)
*H01L 27/146* (2006.01)

(58) Field of Classification Search
USPC .......................................... 348/308
See application file for complete search history.

(56) References Cited

U.S. PATENT DOCUMENTS

2012/0002089 A1* 1/2012 Wang ................ H01L 27/14603
                                                    348/297
2015/0319386 A1* 11/2015 Brady ............... H01L 27/14638
                                                    348/302
2017/0126993 A1* 5/2017 Madurawe ............ H04N 5/355

OTHER PUBLICATIONS

Adachi et al., "A 200-μV/e—CMOS Image Sensor with 100-ke—Full Well Capacity," IEEE Journal of Solid-State Circuits, vol. 43, No. 4, pp. 823-830 (2008).

* cited by examiner

CMOS IMAGE SENSOR WITH DUAL FLOATING DIFFUSIONS PER PIXEL FOR FLICKER-FREE DETECTION OF LIGHT EMITTING DIODES

TECHNICAL FIELD

This disclosure relates generally to image sensors, and in particular but not exclusively, relates to image sensors having pixels for detection of high intensity light sources without the inducement of flicker by the image sensor.

BACKGROUND INFORMATION

High-speed image sensors have been widely used in many applications in different fields including the automotive field, the machine vision field, and the field of professional video photography. Some applications in these fields require the detection and capture of LED lights, which has proven to be difficult. For example, automotive image sensors face the problem of LED flickering. Future automotive vehicle lights, traffic lights and signs will include LED that is pulsed at 90-300 Hz with high peak light intensity. This requires that the minimum exposure time be kept over 10 ms. A very high full well capacity or very low light intensity are thus needed to avoid pixels to get saturated and lose useful information.

Current solutions to address the overflow and loss of useful information from saturated pixels include enhancing the full well capacity with a lateral overflow integrating capacitor (LOFIC). When the photodiode is filled after reaching a corresponding FWC, the excess charge is leaked into a floating drain. A large capacitor connected to the floating drain can then store the excess charge. However, the maximum full well capacity is thus limited by the floating drain capacitor rather than the photodiode full well capacity. Other solutions involve using non-linear sensor (e.g., logarithmic sensors) to enlarge the full well capacity, or using split diode pixels or subpixel sensors to maintain minimum exposure time by minimizing sensitivity of small photodiode.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for an image sensor with pixels that reduce or eliminate flicker induced by high intensity illumination are described herein. In the following description, numerous specific details are set forth to provide a thorough understanding of the examples. One skilled in the relevant art will recognize; however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Figure 1:
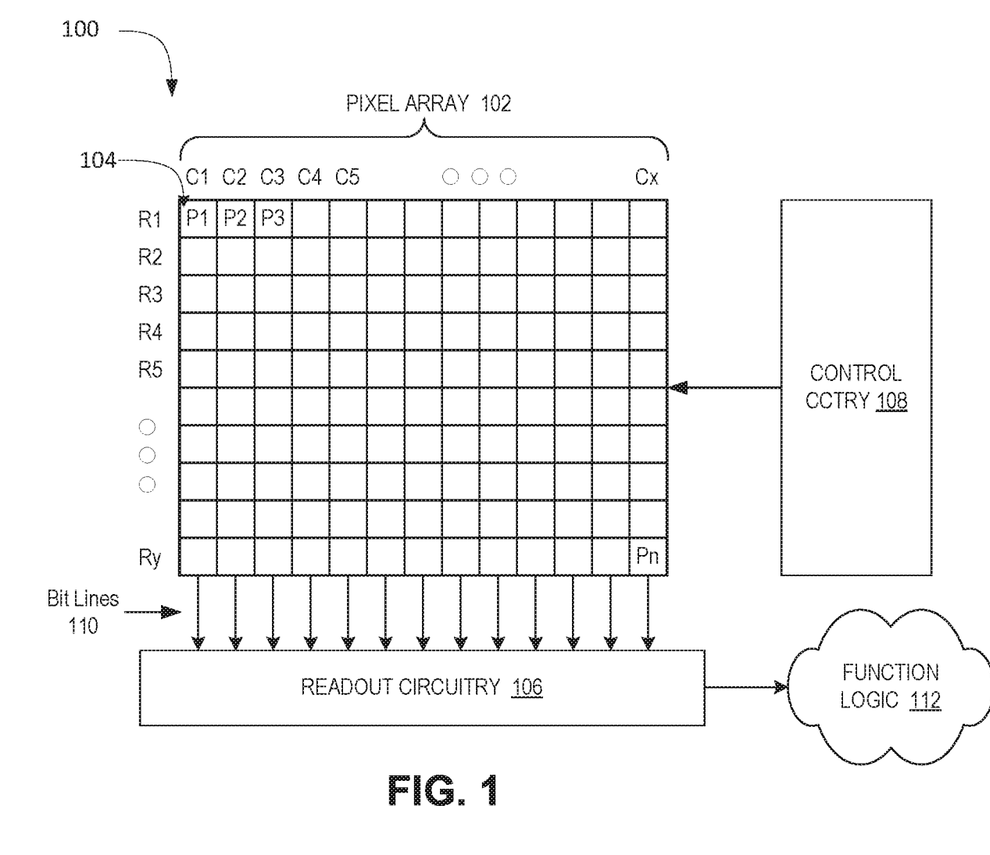
FIG. 1 is a block diagram illustrating an example imaging system that detects high intensity illumination without flickering in accordance with an embodiment of the present disclosure.

FIG. 1 is a block diagram illustrating an example imaging system 100 that detects high intensity illumination without flickering in accordance with an embodiment of the present disclosure. Imaging system 100 may be a complementary metal-oxide-semiconductor ("CMOS") image sensor. As shown in the illustrated embodiment of FIG. 1, imaging system 100 includes pixel array 102 coupled to control circuitry 108 and readout circuitry 106, which is coupled to function logic 112.

The illustrated embodiment of pixel array 102 is a two-dimensional ("2D") array of imaging sensors or pixel cells 104 (e.g., pixel cells P1, P2, . . . , Pn). In one example, each pixel cell is a CMOS imaging pixel. As illustrated, each pixel cell is arranged into a row (e.g., rows R1 to Ry) and a column (e.g., columns C1 to Cx) to acquire image data of a person, place or object, etc., which can then be used to render an image of the person, place or object, etc. In some embodiments, each pixel cell 104 (e.g., pixel cells P1, P2, . . . , Pn) may include a plurality of subpixels respectively including a plurality of photodiodes and a plurality of associated transfer gate transistors and anti-blooming gate transistors.

In one example, after each pixel has acquired its image data or image charge, the image data is read out by readout circuitry 106 through readout column bit lines 110 and then transferred to function logic 112. In some embodiments, there may be two bit lines 110 per pixel. In various examples, readout circuitry 106 may include amplification circuitry (not illustrated), a column readout circuit that includes analog-to-digital conversion (ADC) circuitry, or otherwise. In embodiments having two bit lines 110 per pixel, the read out circuitry 106 may combine image charge provided on the two bit lines 110 and aggregate the image charge into the image data. Function logic 112 may simply store the image data or even manipulate the image data by applying post image effects (e.g., crop, rotate, remove red eye, adjust brightness, adjust contrast, or otherwise). In one example, readout circuitry 106 may read out a row of image data at a time along readout column lines (illustrated) or may read out the image data using a variety of other techniques (not illustrated), such as a serial read out or a full parallel read out of all pixels simultaneously.

In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows. The shutter signal may also establish an exposure time, which is the length of time that the shutter remains open. In one embodiment, the exposure time is set to be the same for each of the frames.

In another example, control circuitry 108 may comprise the horizontal and vertical scanning circuitry, which selects the row and/or column of pixels to be read out. Scanning circuitry may include, selection circuitry (e.g., multiplexers), etc. to readout a row or column of image data at a time along readout column bit lines 109 or may readout the image data using a variety of other techniques, such as a serial readout or a full parallel readout of all pixels simultaneously. When scanning circuitry selects pixels 104 in pixel array 102, the pixels convert light incident to the pixels to a signal and output the signal to column readout circuitry 106. Column readout circuitry 106 may receive the signal from scanning circuitry or from pixel array 102.

Figure 2:
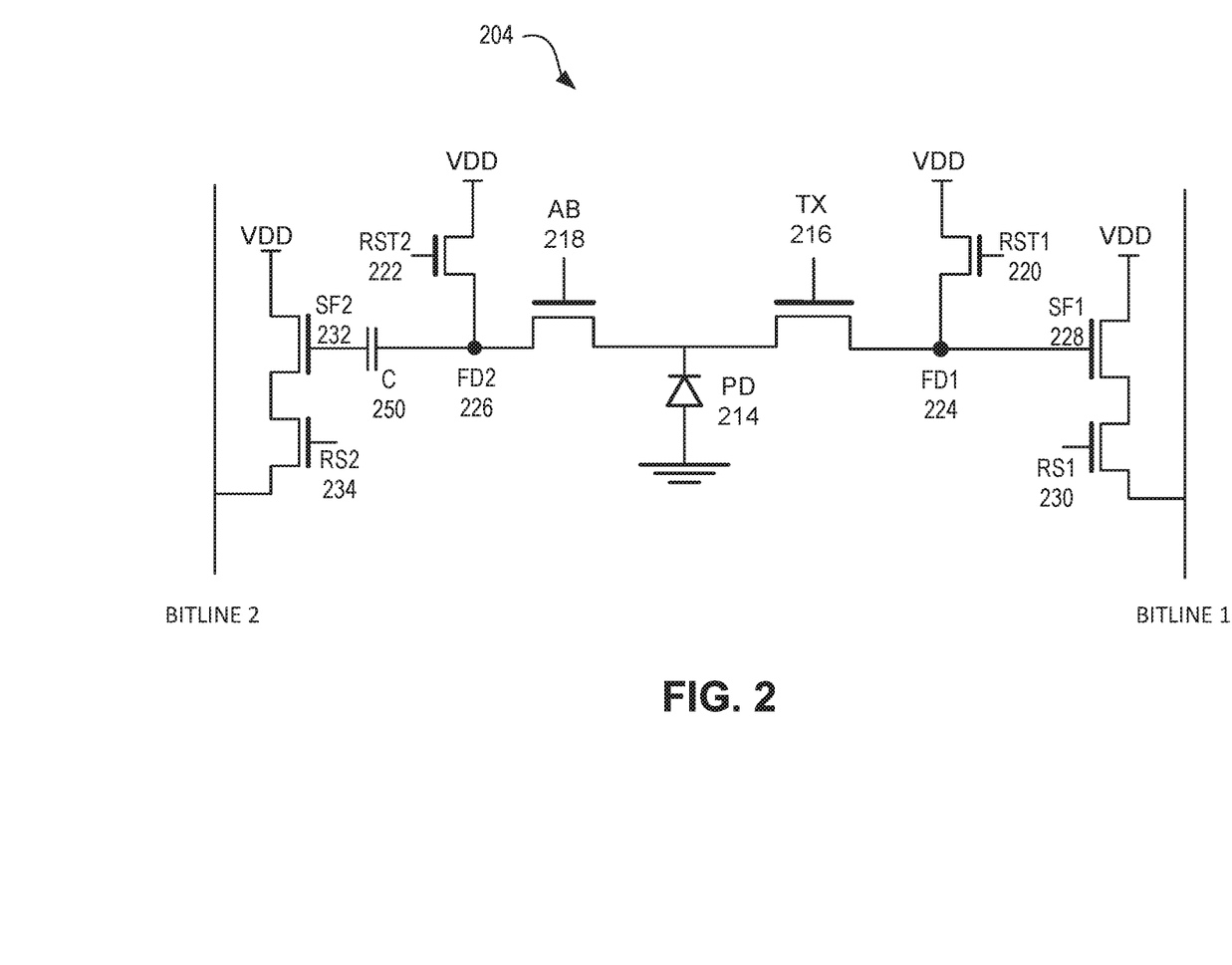
FIG. 2 is an illustrative schematic of a pixel for reducing flickering due to high illumination in accordance with an embodiment of the present disclosure.

FIG. 2 is an illustrative schematic of a pixel 204 for reducing flickering due to high illumination in accordance with an embodiment of the present disclosure. The pixel 204 may be an example of a pixel 104 of pixel array 102. The illustrated embodiment of the pixel 204 includes a photodiode (PD) 214, a transfer gate (TX) 216, an anti-blooming gate (AB) 218, first and second reset transistors (RST1 and RST2) 220 and 222, first and second floating diffusions (FD1 and FD2) 224 and 226, first and second source-follower transistors (SF1 and SF2) 228 and 232, and first and second row selection transistors (RS1 and RS2) 230 and 234. The pixel 204 may be exposed to image light during an integration and generate image charge in response. When a source of the image charge is a high illumination source, which may be a point source at times, such as a light emitting diode (LED), the charge generated by the photodiode 214 may be greater than a full well capacity of the photodiode 214. During such instances, the excess charge, e.g., the charge generated that is greater than the full well capacity of the photodiode 214, may bloom into the second floating diffusion due to the leaky nature of the anti-blooming gate 218.

The first and second floating diffusions 224, 226 may be coupled to the first and second source-follower transistors 228, 232, respectively, through different mechanisms. For example, the first floating diffusion 224 may be directly coupled to a gate terminal of the first source-follower transistor 228, while the second floating diffusion 226 may be capacitively-coupled to a gate of the second source-follower transistor 232. The direct connection may be formed from a metal to semiconductor contact made to the first floating diffusion 224. The capacitor 250 may provide the capacitive coupling between the second floating diffusion 226 and the second source-follower 232.

In some embodiments, the capacitor 250 may be a metal-oxide-semiconductor capacitor. In such an embodiment, the semiconductor side of the capacitor 250 may be coupled to the second floating diffusion 226, and the metal side of the capacitor 250 may be coupled to the gate of the second source-follower transistor 232. The capacitive coupling of the second floating diffusion 226 to the second source-follower transistor 232 may reduce dark current generation in the second floating diffusion 226 due to a lack of a direct metal connection to the second floating diffusion 226.

The first and second reset transistors 220, 222 may be coupled to reset (e.g., discharge or charge the first and second floating diffusions 224, 226, respectively, to a preset voltage) the respective first and second floating diffusions 224, 226 under control of a reset signal received at gates of the first and second reset transistors 220, 222. The first and second floating diffusions 224, 226 may be coupled to gates of the first and second source-follower transistors 228, 232, respectively. The first and second source-follower transistors 228, 232 operate as source-followers providing a high impedance output from the associated first and second floating diffusions 224, 226. Finally, the first and second row select transistors 230, 234 may selectively couple the output of the pixel circuitry in the pixel 204 to the column bitlines 1 and 2 under control of a received row select signal.

Also included in the pixel 204 are a shared source-follower voltage supply connection VDD, column bitline connections, and a shared reset voltage supply connection VDD.

During signal integration, high intensity illumination, from a super bright LED for example, incident on the photodiode 214 may cause the photodiode 214 to generate image charge in an amount greater than a full well capacity, e.g., charge storage capacity, of the photodiode 214. The excess charge may bloom, e.g., transfer, to the second floating diffusion 226 due to a leaky nature of the anti-blooming gate 218. In general, the anti-blooming gate 218 may be leakier than the transfer gate 216. In some embodiments, the anti-blooming gate 218 may be biased at its gate so that a channel is formed to allow the excess charge to bloom to the second floating diffusion 226. The charge amount that is within, e.g., less than, the full well capacity of the photodiode 214 may remain in the photodiode 214 till a read out is performed.

In some instances, the illumination incident on the photodiode 214 may generate charge that is less than the full well capacity of the photodiode 214. In such instances, there may be no excess charge to bloom into the second floating diffusion 226.

During read out after a high intensity illumination event, the charge remaining in the photodiode 214 may be read out on bitline 1 using a four transistor (4T) timing. To read out the excess charge on the second floating diffusion 226, three transistor (3T) timing may be used to read the charge out on bitline 2. The excess charge on the second floating diffusion 226 may cause a voltage to build up on the capacitor 250. In turn, the voltage on the capacitor 250 may enable the second source-follower transistor 232. Depending on the voltage on the capacitor 250, the second source-follower transistor 232 may be enabled into various operating conditions, such as ohmic or saturation. If, for example, the voltage on the capacitor 250 is at a voltage level to induce ohmic operation, the second source-follower transistor 232 may act like a voltage-controlled resistor and provide a portion of VDD to the second row select transistor 234. If, for example, the voltage on the capacitor 250 is at a voltage level to induce saturation, the second source-follower transistor 232 may provide VDD to the second row select transistor 234.

During readout, a readout circuit, such as the readout circuitry 106, may receive voltage representative of the image charge and the excess image charge via bitlines 1 and 2. The readout circuit, in response, may aggregate the image charge and the excess image charge to generate image data, which may then be provided to function logic, for example.

While the illustrated embodiment of pixel 204 depicts only one photodiode, any number of photodiodes may be coupled to the first and second floating diffusions 224, 226. In such embodiments that include multiple photodiodes, each photodiode may be referred to as a subpixel, for example. Additionally, other pixel control functionality may be included in the pixel 204 to assist in operating the pixel in high intensity illumination settings. For example, conversion gain techniques, excess image charge drains, and dual floating diffusion switches, along with other features known to those skilled in the art, may be implemented in the pixel 204.

Figure 3:
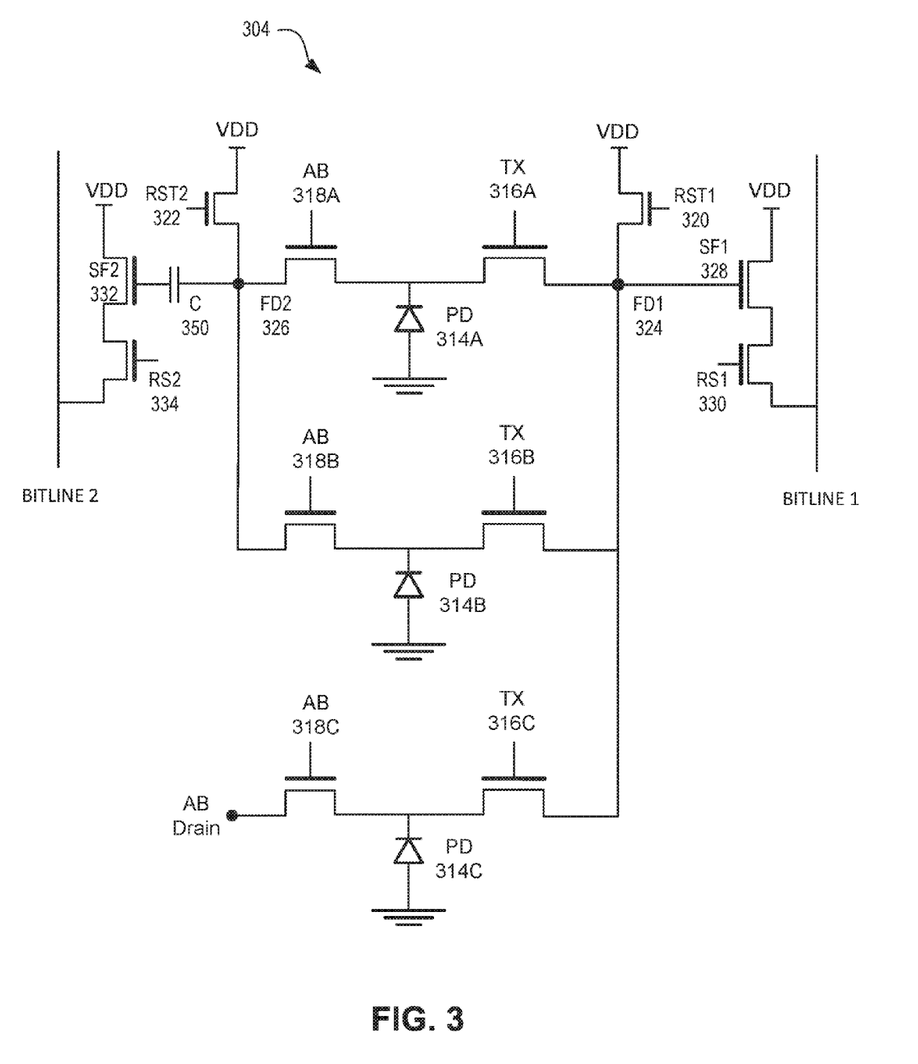
FIG. 3 is an illustrative schematic of a pixel for reducing flickering due to high illumination in accordance with an embodiment of the present disclosure.

FIG. 3 is an illustrative schematic of a pixel 304 for reducing flickering due to high illumination in accordance with an embodiment of the present disclosure. The pixel 304 may be an example of a pixel 104 of pixel array 102. The illustrated embodiment of the pixel 304 includes substantially the same components of the pixel 204, plus additional photodiodes, transfer gates, and anti-blooming gates. In general, the pixel 304 may include a plurality of pixels, or subpixels, all coupled to the first floating diffusion, and some coupled to the second floating diffusion, with each of the plurality of pixels having respective transfer gates and anti-blooming gates. The pixel 304 may limit or eliminate image flicker induced by high illumination sources, for example.

The illustrated embodiment of pixel 304 includes a plurality of photodiodes 314A-C, a plurality of transfer gates 316A-C, and a plurality of anti-blooming gates 318A-C. Additionally, the pixel 304 includes first and second floating diffusions 324 and 326, first and second reset transistors 320 and 322, first and second source-follower transistors 328 and 332, and first and second row select transistors 330 and 334. The plurality of photodiodes 314A-C may be coupled to the first floating diffusion 324 through a respective one of the plurality of transfer gates 316A-C. Further, a subset of the plurality of photodiodes 314A-C may be coupled to the second floating diffusion 326 through respective ones of the plurality of anti-blooming gates 318A-C. Remaining ones of the plurality of photodiodes may be coupled to an anti-blooming (AB) drain, e.g., a voltage reference source, via a respective anti-blooming gate 318. For example, in the embodiment of FIG. 3, the photodiode 314C is coupled to the AB drain via the anti-blooming gate 318C, while the photodiodes 314A, B are coupled to the second floating diffusion 326 via their respective anti-blooming gates 318A, B.

The anti-blooming gates 318A-C may be leakier than their associated transfer gates 316A-C, else they may be biased to be leakier than their associated transfer gates 316A-C. By making the anti-blooming gates 318A-C leakier than their associated transfer gates 316A-C, charge generated in excess of the full well capacity of their associated photodiode 314A-C may bloom into the second floating diffusion 326 and/or the AB drain.

The second floating diffusion 326 and the second source-follower 332 may be capacitively coupled by the capacitor 350. The capacitor 350, which may be a MOS capacitor, may negate the need to provide a direct electrical connection between the gate of the second source-follower 332 and the second floating diffusion 326. Omitting the direct connection between the two may reduce or eliminate dark current generation within the second floating diffusion 326. While the second floating diffusion 326 and the second source-follower 332 are capacitively coupled, the first floating diffusion 324 and the first source-follower 328 may be directly coupled via a metal to semiconductor contact.

The first and second reset transistors 320, 322 may be coupled to reset a voltage of their respective floating diffusions 324, 326 under control of a reset signal received at gates of the first and second reset transistors 320, 322. For example, the reset transistors 320, 322 may discharge or charge the respective first and second floating diffusions 324, 326 to a preset voltage, which may be performed before the integration of image light incident on the photodiodes 314A-C. The first and second floating diffusions 324, 326 may be coupled to gates of the first and second source-follower transistors 328, 332, respectively. The first and second source-follower transistors 328, 332 operate as source-followers providing a high impedance output from the associated first and second floating diffusions 324, 326. Finally, the first and second row select transistors 330, 334 may selectively couple the output of the pixel circuitry in the pixel 304 to the column bitlines 1 and 2 under control of a received row select signal. The first and second reset transistors 320, 322, and the first and second source-follower transistors may be coupled to shared reference voltages, such as VDD.

During signal integration, the photodiodes 314A-C may be illuminated to photogenerate image charge. When, for example, the illumination source is a low light intensity source, the photodiodes 314A-C may generate image charge that is equal to or less than their respective full well capacities, e.g., charge storage capacities. However, when, for example, the illumination source is a high intensity source, such as an LED, the photodiodes 314A-C may generate image charge in excess of their respective full well capacities. As such, the excess image charge may either bloom to the second floating diffusion 326, or to the AB drain, depending on the coupling. For example, the excess charge generated in photodiodes 314A, B may bloom, e.g., transfer, to the second floating diffusion 326, whereas excess charge generated by the photodiode 314C may bloom to the AB drain. Charge bloomed to the AB drain may not contribute to image data, for example. The excess charge may bloom due to the anti-blooming gates 318A-C being leaky, either due to fabrication or biasing.

During read out post a high intensity illumination event, the charge remaining in the photodiodes 314A, B may be read out onto bitline 1 using the four transistor (4T) timing. To read out the excess charge on the second floating diffusion 326, three transistor (3T) timing may be used to read the charge out onto bitline 2. The excess charge on the second floating diffusion 326 may cause a voltage to build up on the capacitor 350. In turn, the voltage on the capacitor 350 may enable the second source-follower transistor 332. Depending on the voltage on the capacitor 350, the second source-follower transistor 332 may be enabled into various operating conditions, such as ohmic or saturation. If, for example, the voltage on the capacitor 350 is at a voltage level to induce ohmic operation, the second source-follower transistor 332 may act like a voltage-controlled resistor and provide a portion of VDD to the second row select transistor 334. If, for example, the voltage on the capacitor 350 is at a voltage level to induce saturation, the second source-follower transistor 332 may provide VDD to the second row select transistor 334.

During readout, a readout circuit, such as the readout circuitry 106, may receive voltage representative of the image charge and the excess image charge via bitlines 1 and 2. The readout circuit, in response, may aggregate the image charge and the excess image charge to generate image data, which may then be provided to function logic, for example.

Figure 4:
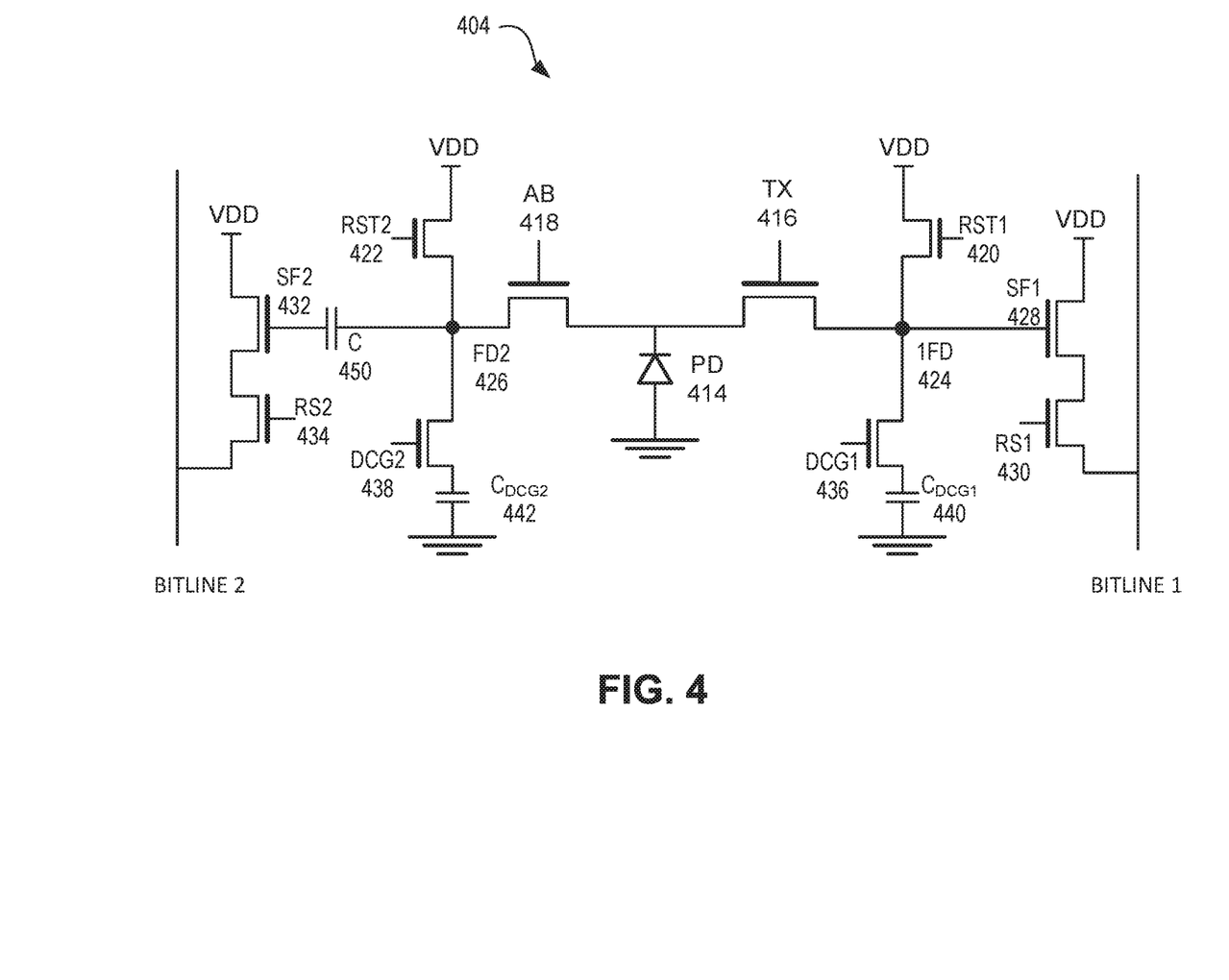
FIG. 4 is an illustrative schematic of a pixel for reducing flickering due to high illumination in accordance with an embodiment of the present disclosure.

FIG. 4 is an illustrative schematic of a pixel 404 for reducing flickering due to high illumination in accordance with an embodiment of the present disclosure. The pixel 404 may be an example of a pixel 104 of pixel array 102. The illustrated embodiment of the pixel 404 includes substantially similar components of the pixel 204 or pixel 304, plus first and second dual conversion gain (DCG) gates (DCG1 and DCG2) 436 and 438, and first and second DCG capacitors ($C_{DCG1}$ and $C_{DCG2}$) 440 and 442. While the pixel 404 is shown to include only a single photodiode, a plurality of photodiodes, similar for instance to the pixel 304, all coupled to the first floating diffusion, and some coupled to the second floating diffusion, with each of the plurality of pixels having respective transfer gates and anti-blooming gates may be included in the pixel 404. The pixel 404 may limit or eliminate image flicker induced by high illumination sources, for example.

For sake of brevity, features of the pixel 404 that have been discussed with respect to pixel 204 and/or pixel 403 of FIGS. 2 and/or 3 will be omitted from the discussion of pixel 404. For example, the second floating diffusion 426 and the second source-follower 432 may be capacitively coupled by the capacitor 450, which may be a MOS capacitor. As such, the second floating diffusion 426 may be coupled to the semiconductor side of the capacitor 450, while the gate of the second source-follower transistor 432 may be coupled to the metal side of the capacitor 450.

The first and second DCG gates 436, 438 may be coupled between the first and second floating diffusions 424, 426, respectively, and the first and second DCG capacitors 440, 442, respectively. The first and second DCG gates 436, 438 may be coupled to selectively adjust a conversion gain of the first and second floating diffusions 424, 426 in response to receiving a DCG signal on their respective gates. For example, in response to receiving a DCG signal, either or both of the DCG gates 436, 438 may couple their respective floating diffusions 424, 426 to the DCG capacitors 440, 442. With the DCG capacitors 424, 426 coupled to respective floating diffusions 424, 426, the conversion gains of the respective floating diffusions 424, 426 may be reduced, for example, due to the DCG capacitors 440, 442, which are coupled to ground, absorbing charge from the first and second floating diffusions 424, 426, respectively. In some embodiments, the DCG capacitors 440, 442 may be selectively coupled to the first and second floating diffusions 424, 426 to increase their respective conversion gains. The DCG signal may be provided by control circuitry, such as the control circuitry 108 for example.

During signal integration, the photodiode 414 may be illuminated to photogenerate image charge. When, for example, the illumination source is a low light intensity source, the photodiode 414 may generate image charge that is equal to or less than its full well capacity, e.g., charge storage capacity. However, when, for example, the illumination source is a high intensity source, such as an LED, the photodiode 414 may generate image charge in excess of the full well capacity. As such, the excess image charge may bloom to the second floating diffusion 426. The excess charge may bloom due to the anti-blooming gate 418 being leaky, either due to fabrication or biasing.

During read out post a high intensity illumination event, the charge remaining in the photodiode 414 may be read out onto bitline 1 using the four transistor (4T) timing or dual conversion gain. To read out the excess charge on the second floating diffusion 426, either three transistor (3T) timing or dual conversion gain may be used to read the charge out onto bitline 2.

During readout, a readout circuit, such as the readout circuitry 106, may receive voltage representative of the image charge and the excess image charge via bitlines 1 and 2. The readout circuit, in response, may aggregate the image charge and the excess image charge to generate image data, which may then be provided to function logic, for example.

While pixel 404 is depicted as having two DCG gates and capacitors, pixel 404 may include only a single DCG gate and capacitor in some embodiments. For example, a single DCG gate and DCG capacitor may be coupled between ground and the first floating diffusion 424. Additionally, multiple photodiodes may be included in the pixel 404, which may be coupled to the first and second floating diffusions 424, 426 similar to the pixel 304.

Figure 5:
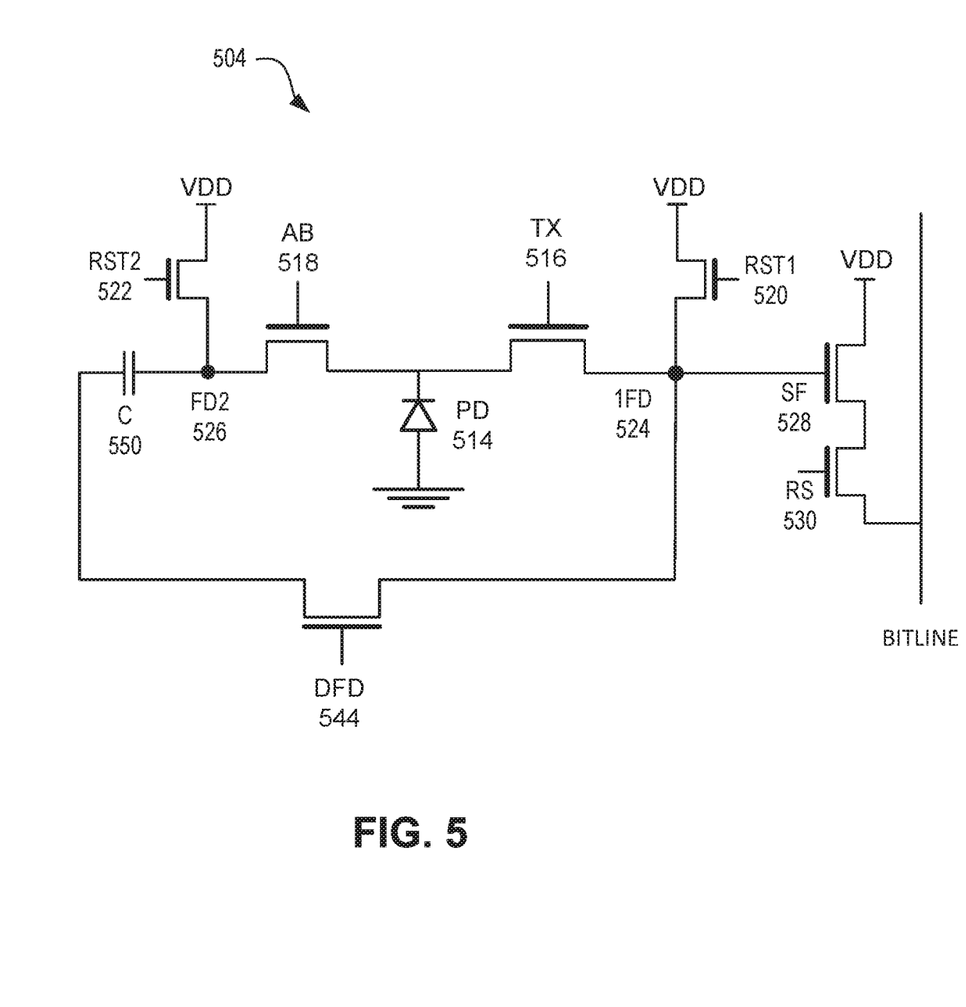
FIG. 5 is an illustrative schematic of a pixel for reducing high intensity light induced flicker in accordance with an embodiment of the present disclosure.

FIG. 5 is an illustrative schematic of a pixel 504 for reducing high intensity light induced flicker in accordance with an embodiment of the present disclosure. The pixel 504 may be an example of the pixel 104. The illustrated embodiment of the pixel 504 includes many of the same components of the pixels 204, 304, and 404, but the pixel 504 may be coupled to a single bitline, instead of multiple bitlines. Additionally, the pixel 504 includes the dual floating diffusion (DFD) transistor 544. The pixel 504 may limit or eliminate image flicker induced by high illumination sources, for example.

For sake of brevity, features of the pixel 504 that have been discussed with respect to pixels 204, 304, and/or 404 of FIGS. 2, 3 and/or 4 will be omitted from the discussion of pixel 504. For example, the second floating diffusion 526 and the second source-follower 532 may be capacitively coupled by the capacitor 550, which may be a MOS capacitor. As such, the second floating diffusion 526 may be coupled to the semiconductor side of the capacitor 550, while the gate of the second source-follower transistor 532 may be coupled to the metal side of the capacitor 550.

The capacitor 550 may be coupled to the DFD transistor 544, which may also be coupled to the first floating diffusion 524. The capacitor 550 may additionally be coupled to the second floating diffusion 526. The DFD transistor 544 may selectively couple the capacitor 550 to the first floating diffusion 524 in response to a DFD signal received, for example, from control circuitry. Example control circuitry may be the control circuitry 108 of the imaging system 100.

During signal integration, the photodiode 514 may be illuminated to photogenerate image charge. When, for example, the illumination source is a low light intensity source, the photodiode 514 may generate image charge that is equal to or less than its full well capacity. However, when, for example, the illumination source is a high intensity source, such as an LED, the photodiode 514 may generate image charge in excess of the full well capacity. As such, the excess image charge may bloom to the second floating diffusion 526. The excess charge may bloom due to the anti-blooming gate 518 being leaky, either due to fabrication or biasing.

During read out post a high intensity illumination event, the charge remaining in the photodiode 514 may be read out onto the bitline using the four transistor (4T) timing. To read out the excess charge on the second floating diffusion 526, three transistor (3T) timing in combination with enabling the DFD transistor 544 may be used to read the charge out onto the bitline via the first floating diffusion 524.

During readout, a readout circuit, such as the readout circuitry 106, may receive voltage representative of the image charge and the excess image charge via bitlines 1 and 2. The readout circuit, in response, may aggregate the image charge and the excess image charge to generate image data, which may then be provided to function logic, for example.

While pixel 504 is depicted as having a single photodiode, multiple photodiodes may be included in the pixel 504, which may be coupled to the first and second floating diffusions 524, 526 similar to the pixel 304.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An image sensor pixel to reduce high illumination-induced flicker comprising:
    a photodiode to capture light and generate charge in response, the photodiode having a charge capacity;
    a transfer gate to selectively transfer charge to a first floating diffusion;
    an anti-blooming gate to selectively transfer excess charge to a second floating diffusion when the generated charge is greater than the photodiode charge capacity, the excess charge being the amount of charge greater than the photodiode charge capacity;
    a first source-follower transistor directly coupled to the first floating diffusion by a gate, the first source-follower to selectively output a first signal to a first bitline in response to enablement of a first row selection transistor;
    a second source-follower transistor capacitively-coupled to the second floating diffusion, the second source-follower to selectively output a second signal to a second bitline in response to enablement of a second row selection transistor;
    first and second dual conversion gain control gates coupled to the first and the second floating diffusions, respectively; and
    first and second dual conversion gain capacitors coupled between the first and the second dual conversion gain control gates, respectively, and a reference voltage;
    wherein a control signal coupled to gate terminals of the first and the second dual conversion gain control gates causes the first and the second dual conversion gain capacitors to be coupled to the first and the second floating diffusions, respectively, to alter a conversion gain of the first and second floating diffusions.

2. The image sensor pixel of claim 1, wherein:
    the photodiode is one of a plurality of photodiodes to capture light and generate charge in response,
    the transfer gate is one of a plurality of transfer gates to selectively transfer the charge from a respective one of the plurality of photodiodes to the first floating diffusion, and
    the anti-blooming gate is one of a plurality of anti-blooming gates to selectively transfer excess charge generated in respective ones of the plurality of photodiodes, wherein a subset of the plurality of anti-blooming gates selectively transfers the excess charge to the second floating diffusion, and wherein remaining ones of the plurality of anti-blooming gates selectively transfer the excess charge to an anti-blooming drain.

3. The image sensor pixel of claim 1, further comprising first and second reset transistors coupled to respective first and second floating diffusions, the first and second reset transistors are coupled to reset the first and second floating diffusions to a preset voltage in response to a reset signal received at a gate terminal of the first and second reset transistors.

4. The image sensor pixel of claim 1, further comprising a capacitor to capacitively-couple the second floating diffusion to a gate of the second source-follower transistor.

5. The image sensor pixel of claim 4, wherein the capacitor is a metal-oxide-semiconductor capacitor having a semiconductor side coupled to the second floating diffusion and a metal side coupled to the gate of the second source-follower transistor.

6. The image sensor pixel of claim 1, wherein the charge transferred to the first floating diffusion is read out under four transistor timing, and wherein the excess charge transferred to the second floating diffusion is read out under three transistor timing.

7. An imaging system for detection of high illumination sources without inducing flicker comprising:
    a pixel array including a plurality of pixels, each pixel including:
        a photodiode to receive image light and generate charge in response, the photodiode having a charge storage capacity;
        first and second floating diffusions;
        a transfer gate to selectively couple charge generated by the photodiode to the first floating diffusion;
        an anti-blooming gate to selectively couple excess charge generated by the photodiode to the second floating diffusion, the excess charge an amount of charge generated in excess of the charge storage capacity of the photodiode;
        first and second source-follower transistors, the first source-follower transistor directly coupled to the first floating diffusion;
        a capacitor to capacitively-couple the second floating diffusion to the second source-follower transistor;
        first and second dual conversion gain control gates coupled to the first and the second floating diffusions, respectively; and
        first and second dual conversion gain capacitors coupled between the first and the second dual conversion gain control gates, respectively, and a reference voltage,
        wherein a control signal coupled to gate terminals of the first and the second dual conversion gain control gates causes the first and the second dual conversion gain capacitors to be coupled to the first and the second floating diffusions, respectively, to alter a conversion gain of the first and the second floating diffusions.

8. The imaging system of claim 7, wherein the capacitor is a metal-oxide-semiconductor capacitor, and wherein a semiconductor side of the capacitor is coupled to the second floating diffusion, and a metal side of the capacitor is coupled to a gate of the second source-follower transistor.

9. The imaging system of claim 7, wherein a gate of the first source-follower transistor is coupled to the first floating diffusion.

10. The imaging system of claim 7, further comprising:
a first row select transistor to selectively couple the first source-follower transistor to a first bitline in response to a row select signal; and
a second row select transistor to selective couple the second source-follower transistor to a second bitline in response to the row select signal.

11. The imaging system of claim 7, further comprising:
a first reset transistor to selectively couple a reference voltage to the first floating diffusion in response to a reset signal; and
a second reset transistor to selectively couple the reference voltage to the second floating diffusion in response to the reset signal.

12. The imaging system of claim 7, wherein:
the photodiode is one of a plurality of photodiodes to capture light and generate charge in response,
the transfer gate is one of a plurality of transfer gates to selectively transfer the charge from a respective one of the plurality of photodiodes to the first floating diffusion, and
the anti-blooming gate is one of a plurality of anti-blooming gates to selectively transfer excess charge generated in respective ones of the plurality of photodiodes, wherein a subset of the plurality of anti-blooming gates selectively transfers the excess charge to the second floating diffusion, and wherein remaining ones of the plurality of anti-blooming gates selectively transfer the excess charge to an anti-blooming drain.

13. An image sensor pixel comprising:
a photodiode to capture image light and generate image charge in response, the photodiode having a full well capacity;
first and second floating diffusions;
a transfer gate coupled to selectively transfer image charge to the first floating diffusion;
an anti-blooming gate coupled to selectively transfer excess image charge to the second floating diffusion, the excess image charge being image charge in excess of the photodiode full well capacity;
a first source-follower transistor directly coupled to the first floating diffusion by a gate of the first source-follower transistor;
a second source-follower transistor capacitively-coupled to the second floating diffusion by a gate of the second source-follower;
first and second row select transistors coupled to selectively couple the first and second source-followers to first and second bitlines, respectively, in response to a row select signal;
first and second reset transistors coupled to reset the first and second floating diffusions, respectively, in response to a reset signal first and second dual conversion gain control gates coupled to the first and the second floating diffusions, respectively; and
first and second dual conversion gain capacitors coupled between the first and the second dual conversion gain control gates, respectively, and a reference voltage,
wherein a control signal coupled to gate terminals of the first and the second dual conversion gain control gates causes the first and the second dual conversion gain capacitors to be coupled to the first and the second floating diffusions, respectively, to alter a conversion gain of the first and the second floating diffusions.

14. The image sensor pixel of claim 13, wherein:
the photodiode is one of a plurality of photodiodes to capture light and generate charge in response,
the transfer gate is one of a plurality of transfer gates to selectively transfer the charge from a respective one of the plurality of photodiodes to the first floating diffusion, and
the anti-blooming gate is one of a plurality of anti-blooming gates to selectively transfer excess charge generated in respective ones of the plurality of photodiodes, wherein a subset of the plurality of anti-blooming gates selectively transfers the excess charge to the second floating diffusion, and wherein remaining ones of the plurality of anti-blooming gates selectively transfer the excess charge to an anti-blooming drain.

15. The image sensor pixel of claim 13, further comprising a metal-oxide-semiconductor capacitor capacitively-coupling the second floating diffusion to the gate of the second source-follower, wherein a semiconductor side of the capacitor is coupled to the second floating diffusion, and a metal side of the capacitor is coupled to the gate of the second source-follower.

\* \* \* \* \*